United States Patent
Lyalin et al.

(10) Patent No.: US 7,146,591 B2
(45) Date of Patent: Dec. 5, 2006

(54) METHOD OF SELECTING CELLS IN LOGIC RESTRUCTURING

(75) Inventors: Iliya V. Lyalin, Moscow (RU); Andrej A. Zolotykh, Moskovskaya (RU); Elyar E. Gasanov, Moscow (RU); Alexei V. Galatenko, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 209 days.

(21) Appl. No.: 10/992,941

(22) Filed: Nov. 19, 2004

(65) Prior Publication Data

US 2006/0112361 A1  May 25, 2006

(51) Int. Cl.
G06F 17/50 (2006.01)
G06F 9/45 (2006.01)

(52) U.S. Cl. .................... 716/9; 716/2; 716/3; 716/9; 716/10; 716/11

(58) Field of Classification Search .............. 716/1–18
See application file for complete search history.

(56) References Cited

U.S. PATENT DOCUMENTS

| 5,524,082 | A | * | 6/1996 | Horstmann et al. | 716/2 |
| 5,726,903 | A | * | 3/1998 | Kerzman et al. | 716/2 |
| 6,260,179 | B1 | * | 7/2001 | Ohsawa et al. | 716/5 |
| 6,532,582 | B1 | | 3/2003 | Zolotykh et al. | 716/11 |
| 6,543,032 | B1 | | 4/2003 | Zolotykh et al. | 716/2 |
| 6,564,361 | B1 | | 5/2003 | Zolotykh et al. | 716/8 |
| 2004/0098676 | A1 | | 5/2004 | Gasanov et al. | 716/2 |

OTHER PUBLICATIONS

Wang et al., Multi-Level Logic Optimization for Low Power using Local Logic Transformations, 1996, IEEE.*
Entrena et al., Combinational and Sequential Logic Optimization by Redundancy Additional and Removal, Jul. 1995, IEEE, vol. 14, pp. 909-916.*
Chang et al., Perturb and Simplify: Multilevel Boolean Network Optimizer, Dec. 1996, vol. 15, p. 1494-1504.*

* cited by examiner

*Primary Examiner*—Vuthe Siek
*Assistant Examiner*—Nghia M. Doan
(74) *Attorney, Agent, or Firm*—Westman, Champlin & Kelly P.A.

(57) ABSTRACT

The present disclosure is directed to a method of selecting cells in an integrated circuit for logic restructuring of an original design. The original design includes a set of parameters. The method includes forming a restructuring set that will include the selected cells for logic restructuring, and a candidate set. The restructuring set includes restructuring cells with an initial cell. The restructuring set is adapted to accept additional cells identified as restructuring cells. The candidate set is adapted to include candidate cells, where each candidate cell in the candidate set is connected to at least one of the restructuring cells in the restructuring set. The candidate set is adapted to remove candidate cells from the candidate set. The restructuring set is adapted to accept selected removed candidate cells as identified restructuring cells if a corresponding parameter is included in the set of parameters.

6 Claims, 5 Drawing Sheets

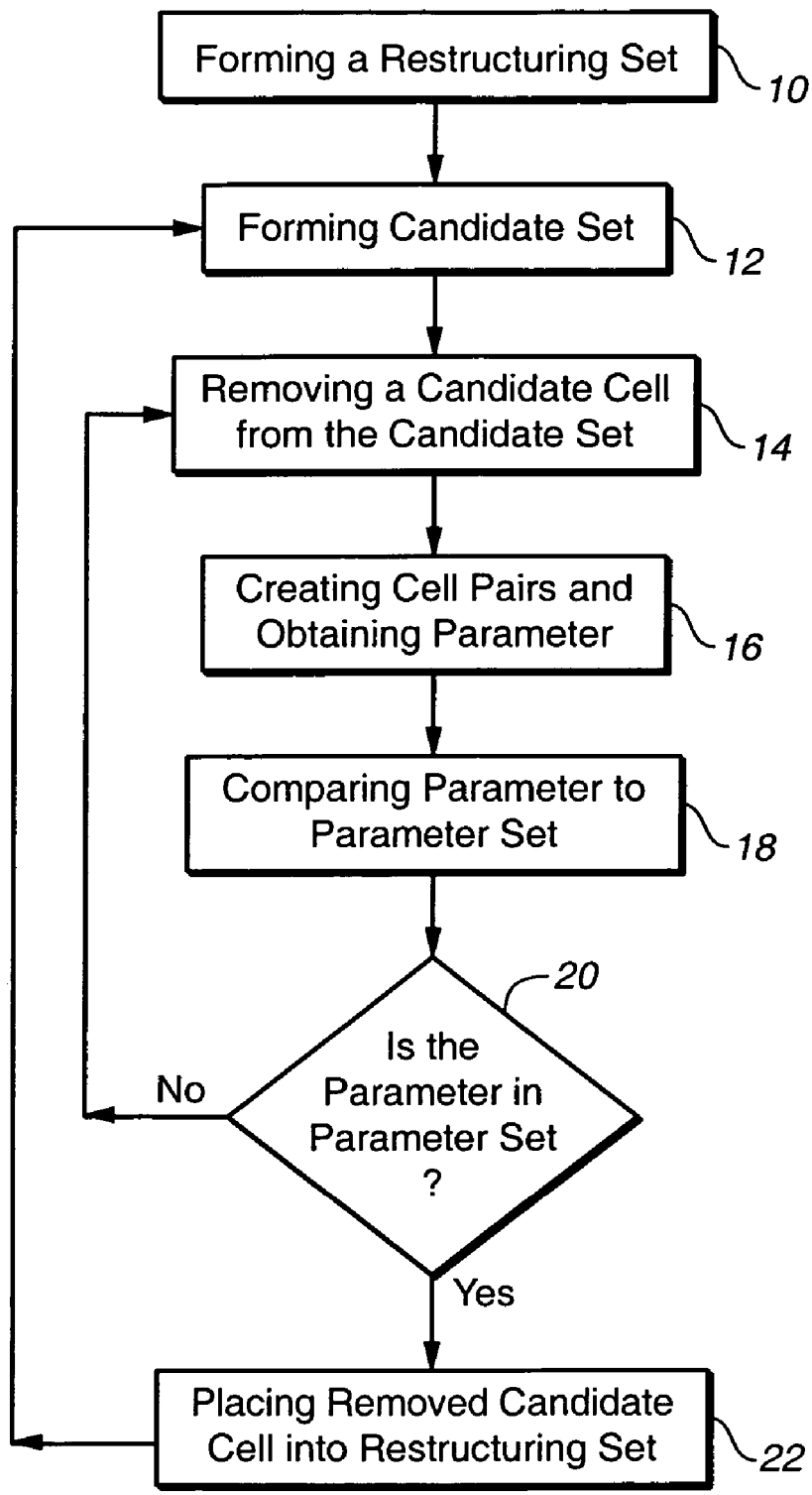
FIG._1

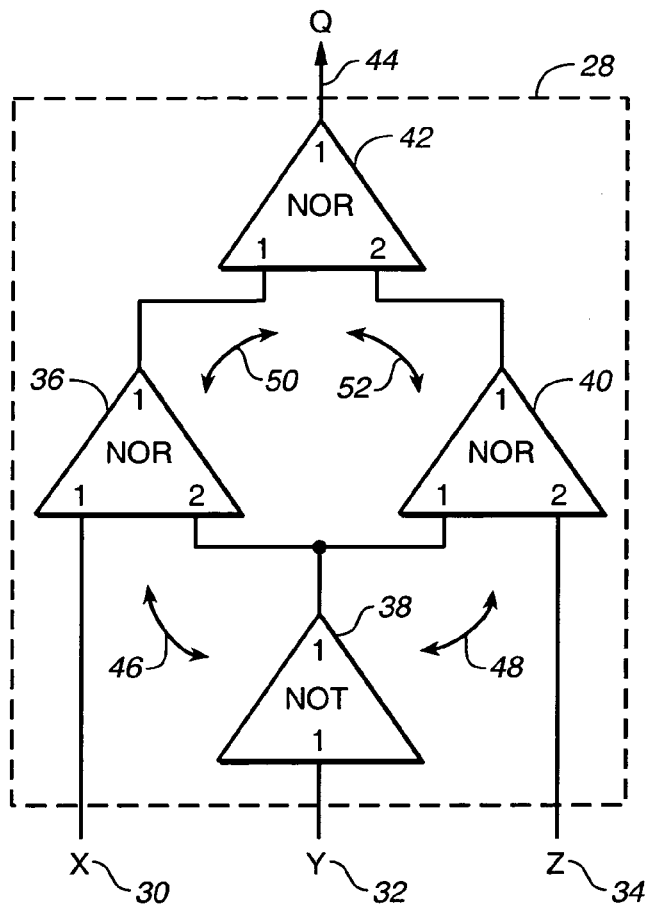
FIG._2A
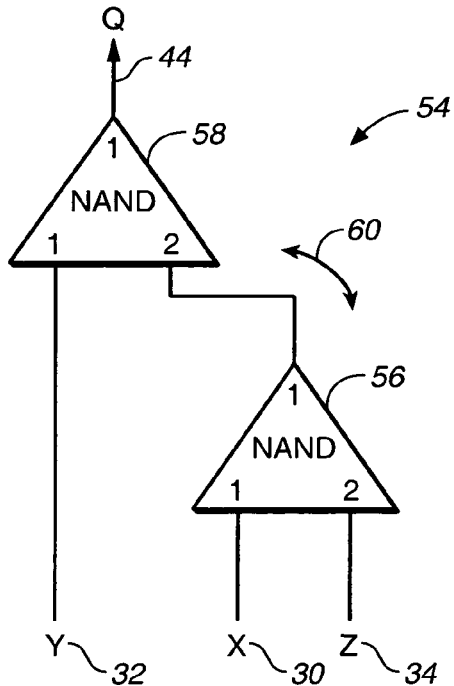
FIG._2B

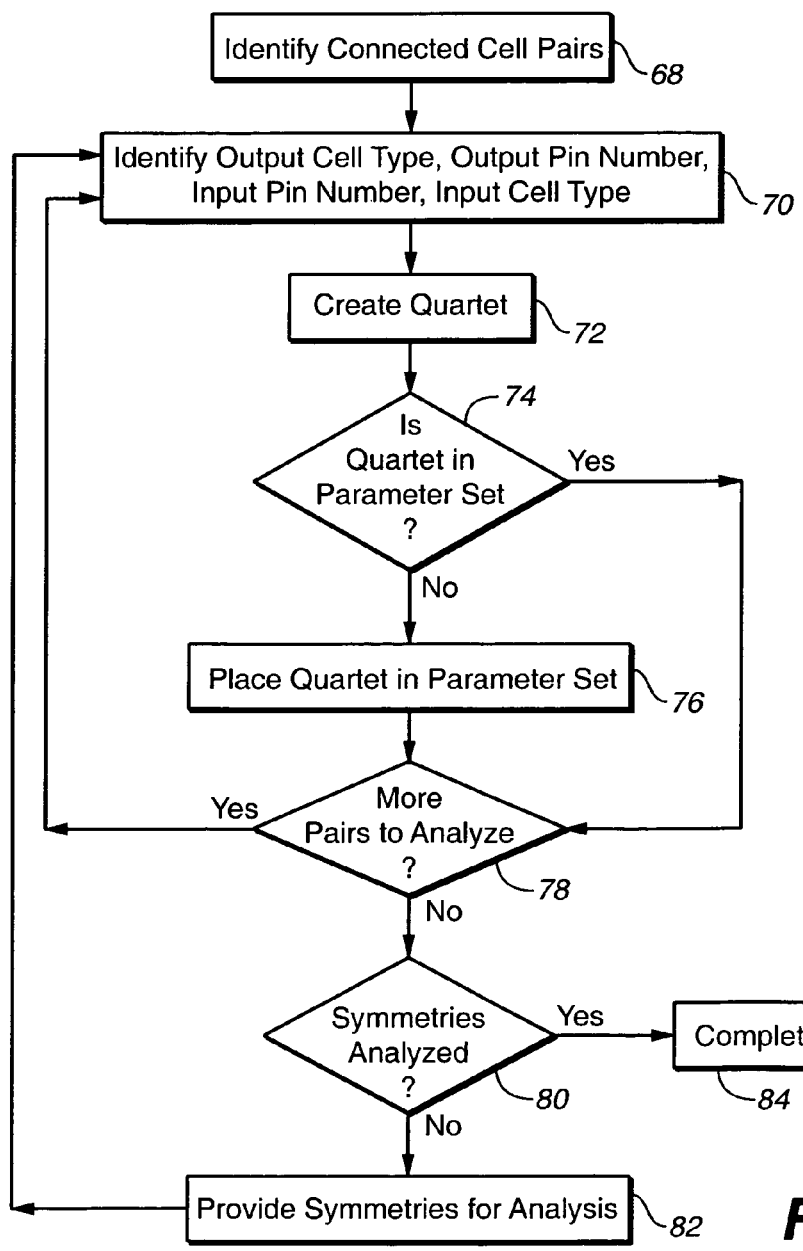
FIG._3
FIG._4

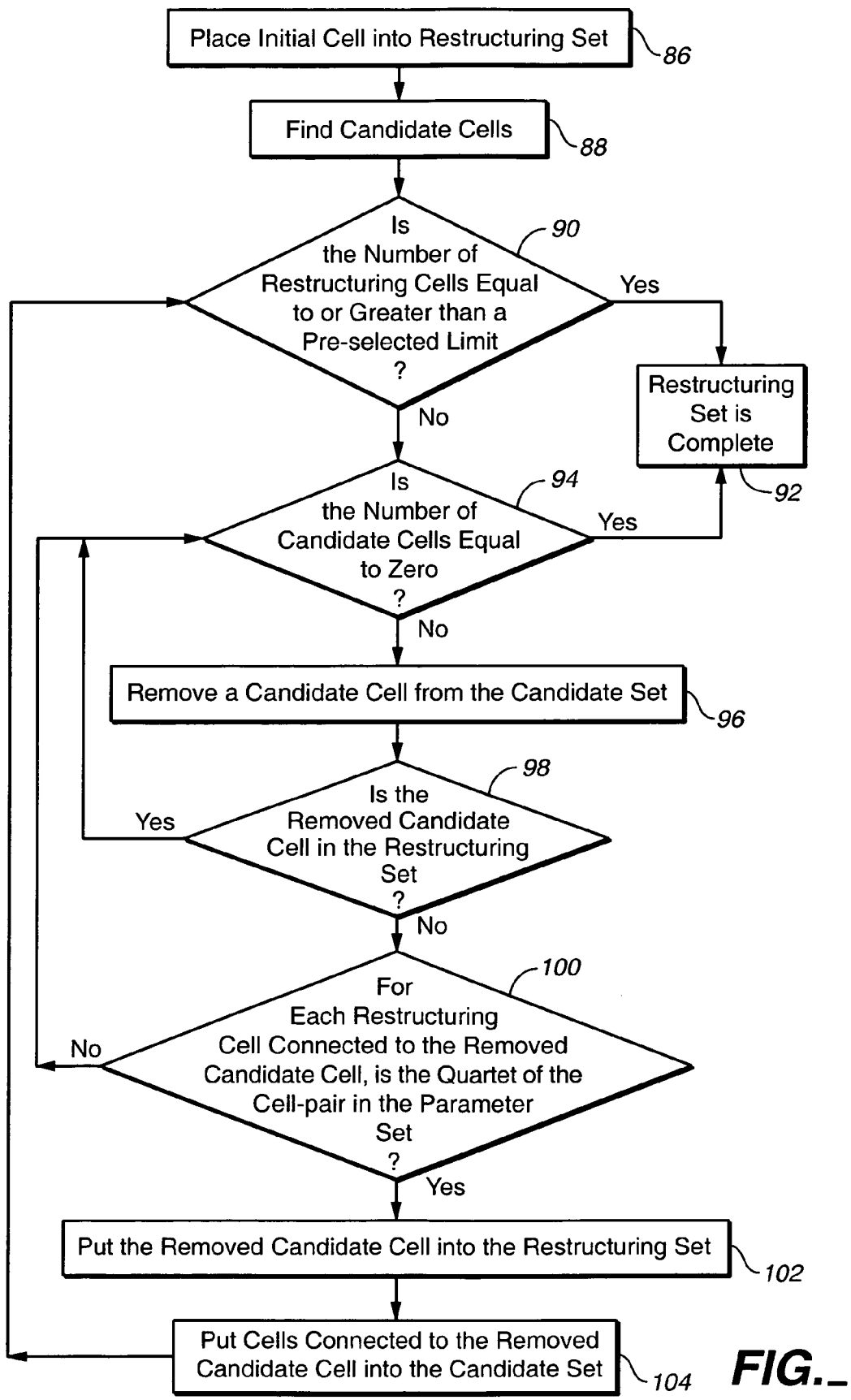
FIG._5

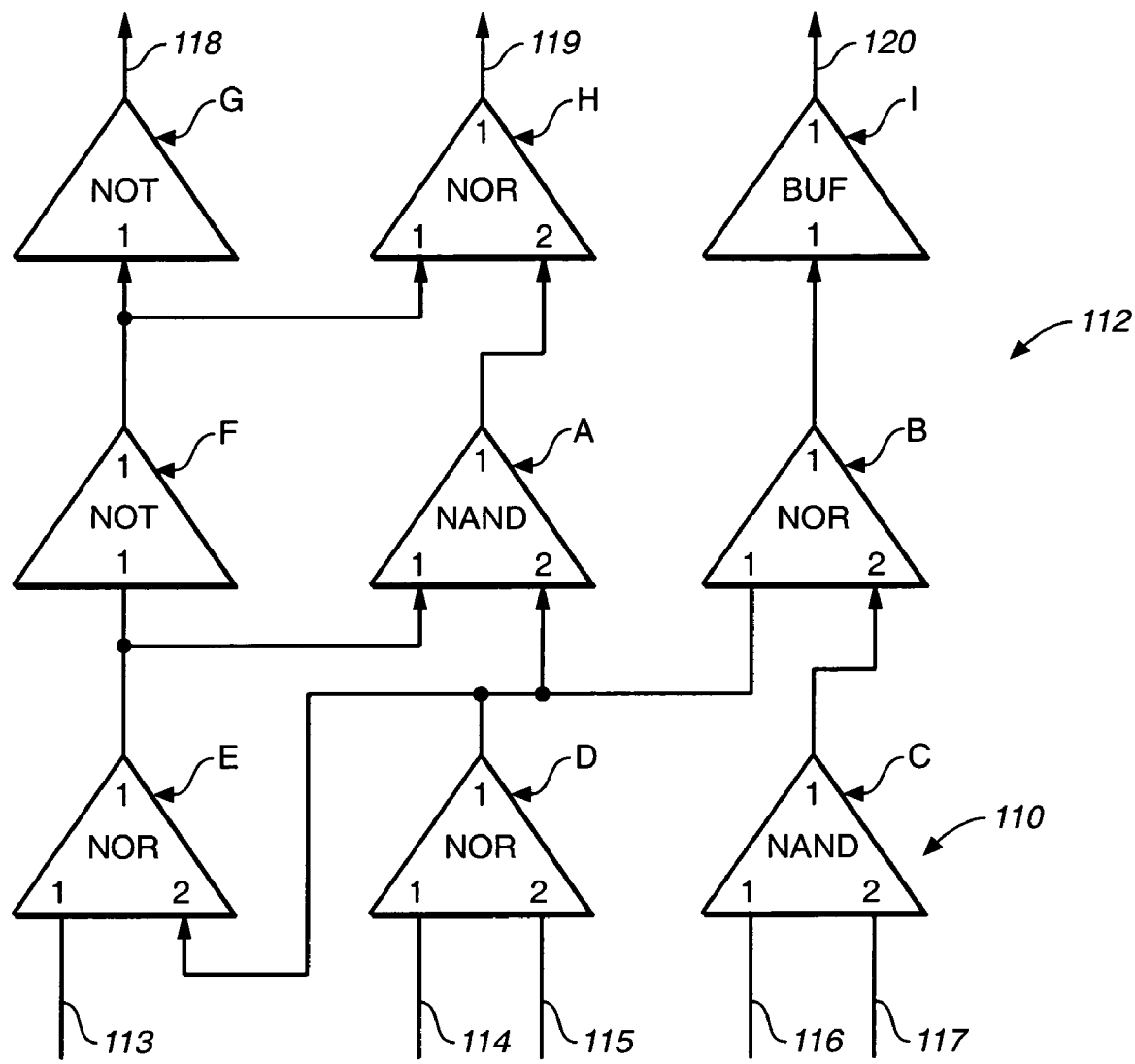
FIG._6

METHOD OF SELECTING CELLS IN LOGIC RESTRUCTURING

FIELD OF THE INVENTION

The present disclosure relates to designing integrated circuits, often referred to as IC's or as chips. More particularly, the present disclosure relates to a method for selecting cells for a logic restructuring of an original logic design on an integrated circuit.

BACKGROUND OF THE INVENTION

Semiconductor integrated circuits are traditionally designed and fabricated by first preparing a schematic diagram or hardware description language (HDL) specification of a logical circuit in which functional elements are interconnected to perform a particular logical function. With standard cell technology, the schematic diagram or HDL specification is synthesized into standard cells of a specific cell library.

Each cell corresponds to a logical function unit, which is implemented by one or more transistors that are optimized for the cell. The logic designer selects the cells according to the number of loads that are attached to the cell, as well as an estimated interconnection required for routing. The cells in the cell library are defined by cell library definitions. Each cell library definition includes cell layout definitions and cell characteristics. The cell layout definition includes a layout pattern of the transistors in the cell, geometry data for the cell's transistors and cell routing data. The cell characteristics include a cell propagation delay and a model of the cell's function. The propagation delay is a function of the internal delay and the output loading (or "fan-out") of the cell.

A series of computer-aided design tools generate a netlist from the schematic diagram or HDL specification of the selected cells and the interconnections between the cells. The netlist is used by a floor planner or placement tool to place the selected cells at particular locations in an integrated circuit layout pattern. The interconnections between the cells are then routed along predetermined routing layers. The design tools then determine the output loading of each cell as a function of the number of loads attached to each cell, the placement of each cell and the routed interconnections.

A timing analysis tool is then used to identify timing violations within the circuit. The time it takes for a signal to travel along a particular path or "net" from one sequential element to another depends on the number of cells in the path, the internal cell delay, the number of loads attached to the cells in the path, the length of the routed interconnections in the path and the drive strengths of the transistors in the path.

A timing violation may be caused by a number of factors. For example, a particular cell may not have a large enough drive strength to drive the number of loads that are attached to that cell. Also, exceptionally long routing paths may cause timing violations. Timing violations are eliminated by making adjustments at each stage in the layout process. For example, the logic diagram can be changed to restructure certain sections of logic to improve timing through that section. In addition, an under-driven cell may be fixed by changing the logic diagram to include a cell having a larger drive strength. An exceptionally long routing path can be corrected by adjusting the placement of the cells. Other changes can also be made Once the timing violations have been corrected, the netlist, the cell layout definitions, the placement data and the routing data together form an integrated circuit layout definition, which can be used to fabricate the integrated circuit.

Logic restructuring is one of the basic steps in optimizing the timing of a chip design. The purpose of logic restructuring is to find a chip design that has an identical logic function of an original chip design but has reduced propagation delays through the circuit. In order to perform a logic restructuring of the original chip design, chip designers apply an algorithm to create a design with a logic function identical to the logic function of the original design. If the new design is more efficient than the original design, the new design will replace the old design. An identity set is created with identical schemes, i.e., logically equivalent systems of cells. The identity set is a set of rules where each rule includes two parts. Each part is a scheme, and schemes that are parts of one rule are logically identical. If a portion of the original chip design is included in the identity set then that portion, or scheme, can be replaced with another scheme in the identity set.

Due to the large number of components and details required, logic restructuring is not practical without the aid of computers. But even when implemented with computers, the algorithms are slow on large designs. The algorithms would work more efficiently if applied to only selected appropriate parts of the integrated circuit, and thus there is a need for a way to select the appropriate parts of an integrated circuit for logic restructuring.

SUMMARY OF THE INVENTION

The present disclosure is directed to a method of selecting cells in an integrated circuit for logic restructuring of an original design. The selected cells can be a subset of the cells of cells in the logic restructuring. The method selects appropriate parts of the design that are large enough for effective application of the logic restructuring algorithms and are small enough to provide for faster application of the algorithms than if the entire design was selected. The present disclosure includes several aspects.

In one aspect, the original design includes a set of parameters. The method includes forming a restructuring set that will ultimately include the selected cells for logic restructuring, and a candidate set. The restructuring set includes restructuring cells with at least an initial cell. The restructuring set is adapted to accept additional cells identified as restructuring cells. The candidate set is adapted to include candidate cells, where each candidate cell in the candidate set is connected to at least one of the restructuring cells in the restructuring set. The candidate set is adapted to remove candidate cells from the candidate set. And the restructuring set is adapted to accept selected removed candidate cells as identified restructuring cells if a corresponding parameter is included in the set of parameters.

In one example, the parameter corresponds to a cell pair formed between a selected restructuring cell and a connected removed candidate cell. Also, the candidate set is adapted to accept additional cells connected to the identified restructuring cells.

In another aspect of the disclosure, the method also forms a candidate set adapted to include candidate cells, where each candidate cell is connected to at least one of the restructuring cells. The method includes a step (A) where it returns a complete restructuring set if the number of restructuring cells is equal to or greater than a pre-selected limit, or if the number of candidate cells is equal to zero. If neither condition in step (A) is met, then the method removes a selected candidate cell from the candidate set, and for each restructuring cell connected to the selected removed candidate cell, the method determines a corresponding cell pair parameters. If the cell pair parameter is included in the parameter set, then the method places the removed candidate cell into the restructuring set. If it is not included, the method returns to step (A). The method places all cells connected to the removed candidate cell into the candidate set and proceeds back to step (A).

In still another aspect of the disclosure, the method steps are instructions of a software program that can be implemented on a general purpose computer.

BRIEF DESCRIPTION OF THE DRAWINGS

FIG. 1 is flow diagram of an example of the present method.

FIG. 2A is a schematic diagram of an actual original logic circuit design suited for logic restructuring with the method of FIG. 1.

FIG. 2B is a schematic diagram of a circuit design that is logically identical to the design of FIG. 2A.

FIG. 3 is flow diagram of an example of one aspect of the method of FIG. 1.

FIG. 4 is a flow diagram of a more specific example of the aspect of the method of FIG. 3.

FIG. 5 is a flow diagram of another example of the present method.

FIG. 6 is a schematic diagram of selected cells in an example applying the present method.

DETAILED DESCRIPTION OF ILLUSTRATIVE EMBODIMENTS

This disclosure relates to a method of selecting cells for a logic restructuring. The disclosure, including the figures, describes the method with reference to several illustrative examples. For instance, the disclosure proceeds with respect to two illustrated example processes and a working example process described below. However, it should be noted that the present invention could be implemented in other forms, as well. The present invention is described with the examples for illustrative purposes only. Other examples are contemplated and may be mentioned below or are otherwise imaginable to someone skilled in the art. The scope of the invention is not limited to the few examples, i.e., the described embodiments of the invention. Rather, the scope of the invention is defined by reference to the appended claims. Changes can be made to the examples, including alternative designs not disclosed, and still be within the scope of the claims.

An example procedure for logic restructuring of an original chip design can include obtaining a set of parameters for the original chip design, selecting the cells of an integrated circuit for logic restructuring of the original design based on the parameters, applying an optimization algorithm to the selected cells of the integrated circuit, and accepting the logic restructuring if the optimization algorithm provides a preferred design. FIG. 1 is a flow diagram illustrating an example method of selecting cells in an integrated circuit for logic restructuring of an original design based on the parameters of the original design. The example method is described generally, and details of the method, including a working example, are described below.

The method of FIG. 1 includes forming a restructuring set of restructuring cells 10 that, when the method is completed, will become the cells selected as the appropriate parts of the design suitable for logic restructuring. The restructuring set is initially empty. The chip designer places an initial cell, or cells, into the restructuring set. The initial cell is a cell located in the chip design, and the designer chooses the initial cell based on which portion of the chip design is selected for restructuring. The method also includes forming a candidate set 12. The candidate set includes candidate cells, often referred to as neighboring cells, which are cells that are logically connected directly to the restructuring cells in the restructuring set. Cells that are logically connected directly to each other do not have intermediate cells between the logic connections. Restructuring cells are selected from the set of candidate cells. To begin the method in this example, the initial cell is included in the restructuring set and the candidate set includes the cells logically connected directly, i.e., "connected," to the initial cell.

The method involves determining which candidate cells are to become restructuring cells. In order to make this determination, a candidate cell is removed from the candidate set 14. A cell pair is created with the removed candidate cell and a connected restructuring cell in the restructuring set 16. The original design includes a set of parameters, or parameter set, based on the cell pairs in the original design. The cell pair created with the candidate cell and restructuring cell includes a cell pair parameter, and the cell pair parameter is compared to the parameters in the parameter set 18. If the cell pair parameter is included in the parameter set 20, the candidate cell is identified as a restructuring cell and placed into the restructuring set 22. The candidate set is re-formed at step 12 to include all cells connected to the newly identified restructuring cell. If the candidate cell is not identified as a restructuring cell, the method returns to 14 where another candidate cell is removed from the candidate set 14. In one embodiment, the candidate cells in the candidate set are mutually exclusive of the restructuring cells.

The method proceeds until at least one of two conditions is met. The first condition is that the number of restructuring cells in the restructuring set has reached a pre-selected limit. The second condition is that the candidate set is empty. Once the method is complete, the restructuring cells in the restructuring set become the cells selected for logic restructuring. Once the restructuring set is selected, the chip designer will apply optimization algorithms to the restructuring cells to complete the logic restructuring.

The process of creating the parameters in the parameter set is described with respect to an example of logically equivalent chip designs 28, 54 shown in FIGS. 2A and 2B. Designs 28 and 54 illustrate an identity, and can be considered to be included in an Identity Set.

FIG. 2A is an exemplary and simple original chip design 28. This design 28 includes four logic cells, i.e, NOR gates 36, 40, 42 and NOT gate 38; and also includes three input pins, i.e., pins X indicated at 30, Y indicated at 32 and Z indicated at 34; and an output pin Q indicated at 44. Pin X 30 is connected to input pin 1 of NOR gate 36. Pin Y 32 is connected to input pin 1 of NOT gate 38. Pin Z 34 is connected to input pin 2 of NOR gate 40. Output pin 1 of NOT gate 38 is connected to input pin 2 of NOR gate 36 and to input pin 1 of NOT gate 38. Output pin 1 of NOR gate 36 is connected to input pin 1 of NOR gate 42. Output pin 1 of NOR gate 40 is connected to input pin 2 of NOR gate 42. Output pin 1 of NOR gate 42 is design output Q indicated at 44. The design includes four cell pairs. The first cell pair is indicated by arrow 46 and includes NOT gate 38 connected to NOR gate 36. The second cell pair is indicated at arrow 48 and includes NOT gate 38 connected to NOR gate 40. The third cell pair is indicated at arrow 50 and includes NOR gate 36 connected to NOR gate 42. The fourth cell pair is indicated at arrow 52 and includes NOR gate 40 connected to NOR gate 42.

A circuit design 54 that is logically identical to the design 28 is shown in FIG. 2B. Like parts have like reference numerals. Design 54 includes pins X indicated at 30, and Z indicated at 34 connected to input pins 1 and 2, respectively, of NAND gate 56. Pin Y indicated at 32 and output pin 1 of NAND gate 56 are connected to input pins 1 and 2, respectively, of NAND gate 58. The output of NAND gate 58 is output Q indicated at 44. NAND gates 56 and 58 form a cell pair indicated by arrow 60.

An example of a cell pair parameter for each cell pair suitable for use in the described method sets forth the cells and connection types for the cell pair. This parameter is known as a Quartet, and includes four pieces of information: (1) the cell type of the output cell of the cell pair; (2) the output pin number of the output cell in the connection; (3) the input pin number of the input cell in the connection; and (4) the cell type for the input cell of the cell pair. A quartet can be written as:

(<output cell type>,<output pin number>,<input pin number>,<input cell type>), or as: $(t_1, o, i, t_2)$ The quartet provides the information that there is a scheme in the Identity Set where a cell of the type <output cell type> is connected with another cell of the type <input cell type>, and moreover that <output pin number> of the cell is connected with <input pin number> of the another cell.

A quartet can be obtained for each cell pair in the Identity Set, and the cell pairs represent schemes. (The quartet can also be referred to as a cell pair parameter in this case.) For example, in cell pair 50 of design 28, the output cell is NOR gate 36; the output pin number of the gate 36 is output pin 1; the input pin of the gate 42 is pin 1; and the cell type of the input cell is NOR gate 42. The quartet can be written as (NOR, 1, 1, NOR). In cell pair 52, the output cell is NOR gate 40; the output pin number is pin 1; the input pin number of the input cell is pin 2; and the input cell type is NOR gate 42. The quartet for this cell pair 52 can be written as (NOR, 1, 2, NOR). The quartets for cell pairs 46 and 48 are (NOT, 1, 2, NOR) and (NOT, 1, 1, NOR) respectively. The quartet for the cell pair 60 of design 54 is (NAND 1, 2, NAND). This quartet is also included in the parameter set.

In the present method, the parameter set not only includes parameters from the designs 28, 54, but also from a symmetrical design. A symmetrical design exists for design 54. For example, output pin 1 of NAND gate 56 could be connected input pin 1 of NAND gate 58 (and pin Y 32 could be connected to input pin 2 of NAND gate 58). The resulting parameter (NAND, 1, 1, NAND) should also be included in the parameter set.

Boolean function symmetries and construction of symmetry vectors and symmetry trees are described in U.S. Patent Application Publication No. US 2004/0098676 A1, which is incorporated by reference into this disclosure. An entry symmetry vector can be constructed from a Boolean function symmetry tree described in the reference. SYM (<Cell>) is the entry symmetry vector for <Cell>. SYM (<Cell>) has the same number of elements as the number of entries of <Cell>. Each element of SYM(<Cell>) is a number. If two inputs are symmetrical then the corresponding numbers are equal. For instance:
SYM(NAND($x_1$, $x_2$))=(1, 1)

SYM(NAND(NOR($x_1$, $x_2$), $x_3$))=(1, 1, 2)

For each quartet $(t_1, o, i, t_2)$, if (SYM($t_2$)[i]=SYM ($t_2$) [j]) then the quartet $(t_1, o, j, t_2)$ is added to the parameter set.

FIG. 3 describes generally an example process of obtaining parameters for the parameter set. The process identifies connected cell pairs in both the actual chip design and the symmetrical design at step 62. The process identifies the parameters for connected cell pair at step 64. The parameter set includes the identified parameters at step 66. To minimize the size of the parameter set, the parameter set can be configured to accept only unique parameters.

FIG. 4 describes generally an example process of obtaining quartets for the parameter set, and is a more specific process of the process shown in FIG. 3. The connected cell pairs are identified in the actual design 68. For a given cell pair identified in 68, the output cell type, the input cell type, the output pin number and the input pin number are identified at step 70. Based on the information from step 70, a quartet is created at step 72. If the quartet is unique at step 74, then the quartet is placed in the parameter set at step 76. If the quartet is not unique at step 74, then the process repeats to analyze another cell pair at step 78 until they are complete. Once all of the cell pairs are complete at step 78, the process checks to see if the cell pairs from the symmetrical design have been analyzed at step 80. If not, the cell pairs for the symmetrical pairs are identified, and they are analyzed in steps 70, 72, 74, 76 and 78. Once all of the symmetrical pairs have been analyzed at step 80, the parameter set is complete 84.

Once the parameters in the set have been identified, they can be further processed to provide for fast searching and comparison, such as in block 18 of FIG. 1. For example, each unique parameter can be given a code, and the cell pair parameter can be compared against the code. One such code would assign the output cell type a number up to the number of all possible output cell types in the design; the output pin would be assigned a number up to the number of all possible output pins in the design; the input pin would be assigned a number up to all possible input pins in the design; and the input cell type would be assigned a number up to the number of all possible input cell types in the design. The code could be some combination of these numbers.

One example of a fast search method of the parameter set is described below. The number of cell types is CellTypNum and that the type of a given cell is in the range from 0 to CellTypNum −1. The maximum number of input pins for the cells is MaxInPinNumber, and the maximum number of output pins for the cells is MaxOutPinNumber. A bit array Quartet is allocated in computer memory, which size is CellTypNum*MaxInPinNumber*MaxOutPinNumber*CellTypNum Bit Quartet [$t_1$] [o] [i]0 [$t_2$] is equal to one only if there is a quartet such that: (1) <output cell type>=$t_1$; (2) <output pin number>=o; (3) <input pin number>=i; and (4) <output cell type>=$t_2$.

FIG. 5 shows a more particular method of the present disclosure. In this method, the initial cell is placed into the restructuring set 86 and the candidate cells of the initial cell, i.e., the cells connected to the initial cell are placed into the candidate set 88. If the number of the restructuring cells is equal to or greater than a pre-selected limit 90, then the process is finished and the restructuring set is complete 92. If the number is less than the pre-selected limit 90, the question becomes whether the number of candidate cells is zero 94. If the answer is yes, the process is finished and the restructuring set is complete 92. If the candidate set includes candidate cells, a candidate cell is removed from the candidate set 96. If the removed candidate cell is already in the restructuring set 98, the process returns to block 94. If the removed candidate cell is not already in the restructuring set, then for each restructuring cell connected to the removed candidate cell, the process determines whether the quartet of the resulting cell pair is in the parameter set 100. If no, then the process returns to block 94. If yes, then the removed candidate cell is placed into the restructuring set 102, and the candidate cells of the removed candidate cell are placed into the candidate set 104. The process then returns to block 90.

FIG. 6 shows a schematic diagram of a plurality of cells 110 and connections between them that represent a portion of a chip 112. An example of the methods shown in FIGS. 1 and 5 are now described with respect to the cells shown in FIG. 6. FIG. 6 shows NAND gates A and C; NOR gates B, D, E, and H; NOT gates F and G; and Buffer I connected together with input pins and output pins. The chip portion 112 receives inputs from pins 113, 114, 115, 116, and 117; and provides outputs on pins 118, 119 and 120. The quartets in the parameter set are given as (NOR, 1, 1, NOR); (NOR, 1, 2, NOR); (NOT, 1, 2, NOR); (NOT, 1, 1, NOR); (NAND, 1, 2, NAND); (NOR, 1, 1, NOT); and (NAND, 1, 1, NAND). In this example, the quartets are determined from the example above in connection with FIGS. 2A and 2B.

The designer selects an initial cell for the restructuring set 86. In the example, the initial cell is cell D, which is a NOR gate. The candidate cells connected to cell D are cells E, A and B, and are placed in the candidate set. For this example, the restructuring set does not have a pre-selected limit or maximum size Cell E is removed from the candidate set, and the only cell currently in the restructuring set connected to cell E is cell D. Cells D and E are NOR gates. Cell D is the output cell with output pin number 1 connected to input pin number 2 of cell E. The quartet of cell pair D-E is (NOR, 1, 2, NOR). This quartet is in the parameter set, so cell E becomes a restructuring cell and is placed into the restructuring set. The candidate cells of cell E, which are not in the restructuring set, include cells A and F. The restructuring set now includes cells D and E, and the candidate set now includes A, B and F.

Cell A is removed from the candidate set, and the restructuring cells connected to cell A are cells D and E. A cell pair is first formed with cell A and cell D. Cell D is a NOR gate and Cell A is a NAND gate. Cell D is the output cell providing an output on pin 1 to input pin 2 on cell A. The quartet is (NOR, 1, 2, NAND). This quartet is not in the given parameter set. A cell pair is then formed with cells A and E. Cell E is a NOR gate providing an output on pin 1 to input pin 1 of cell A. The quartet is (NOR, 1, 1, NAND). Again, this quartet is not in the parameter set. The method proceeds with cell A removed from the candidate set and not placed in the restructuring set. The restructuring set now includes cells D and E; and the candidate set now includes cells B and F.

Cell B is now removed from the candidate set, and the only restructuring cell connected to cell B is cell D. Cell D provides an output on pin 1 to input pin 1 of NOR gate cell B. The resulting quartet is (NOR, 1, 1, NOR), which is in the parameter set. Cell B is placed into the restructuring set and the candidate cells of cell B, i.e., cells C and I, are placed into the candidate set. The restructuring set now includes cells D, E, and B; and the candidate set now includes cells F, C, and I.

Cell F is now removed from the candidate set, and the only restructuring cell connected to cell F is cell E. Cell E is a NOR gate and cell F is a NOT gate. Cell E provides an output on pin 1 to input pin 1 of cell F. The resulting quartet is (NOR, 1, 1, NOT), which is in the parameter set. Cell F is placed in the restructuring set and the candidate cells of cells F, i.e., cells G and H, are placed into the candidate set. The restructuring set now includes cells D, E, B, and F; and the candidate set now includes cells I, C, G, and H.

Cell I is now removed from the candidate set, and the only restructuring cell connected to cell I is cell B. Cell I is a Buffer (BUF) and cell B is a NOR gate. Cell B provides an output on pin 1 to input pin 1 of cell I. The resulting quartet is (NOR, 1, 1, BUF), which is not in the parameter set. The restructuring set now includes cells D, E, B, and F; and the candidate set now includes cells C, G, and H.

Cell C is now removed from the candidate set, and the only restructuring cell connected to cell C is cell B. Cell C is a NAND gate and cell B is a NOR gate. Cell C provides an output on pin 1 to input pin 2 of cell B. The resulting quartet is (NAND, 1, 2, NOR), which is not in the parameter set. The restructuring set now includes cells D, E, B and F; and the candidate set now includes cell G and H.

Cell G is now removed from the candidate set, and the only restructuring cell connected to cell G is cell F. Cells F and G are NOT gates. Cell F provides an output on pin 1 to input pin 1 on cell G. The resulting quartet is (NOT, 1, 1, NOT), which is not in the parameter set. The restructuring set now includes cell D, E, B and F; and the candidate set now includes cell H.

Cell H is now removed from the candidate set, and the only restructuring cell connected to cell H is cell F. Cell H is a NOR gate and cell F is a NOT gate. Cell F provides an output on pin 1 to input pin 1 of cell H. The resulting quartet is (NOT, 1, 1, NOR), which is in the parameter set. Cell H is placed in the restructuring set, and the candidate cell of set H, i.e., only cell A, is placed into the candidate set. The restructuring set now includes cells D, E, B, F and H; and the candidate set now includes cell A.

Cell A is included in the candidate set for the second time during this process. Cell A is now removed from the candidate set, and the restructuring cells connected to cell A are cells D, E, and H. Cell A is a NAND gate. The resulting quartets for cell pairs A-E and A-D are not in the parameter set, as described above. Cell A provides an output on pin 1 to input pin 2 of NOR gate cell H. The resulting quartet is (NAND, 1, 2, NOR), which is also not in the parameter set. The restructuring set now includes cells D, E, B, F and H; and the candidate set is now empty. The method cannot remove another cell from the candidate set. Thus, the restructuring set is complete.

In this particular example, cell A is a bounded cell. A bounded cell is not a restructuring cell after the method is complete, but every input and output of the bounded cell is connected to restructuring cells selected with the method. The inputs and outputs of Cell A are connected to restructuring cells D, E, and H. In a variation of the method described above, bounded cells are included in the restructuring set for the sake of convenience. There is little chance that a bounded cell will be used in the logic restructuring, but inclusion of bounded cells can reduce the amount of inputs and outputs to a selected cell portion, and the bounded cell could possibly be included if a restructuring cell later becomes changed. In the present example, the restructuring set includes cells D, E, B, F, and H selected by the method and also includes bounded cell A.

The methods described above can be implemented in Computer Aided Design (CAD) software that can now form part of a chip design software package. The software can be a series of computer-executable steps on a computer readable medium that is suitable for use with a general purpose computer. One such package is described in U.S. Pat. No. 6,564,361, which is incorporated by reference into this disclosure.

The present invention has now been described with reference to several embodiments. The foregoing detailed description and examples have been given for clarity of understanding only. Those skilled in the art will recognize that many changes can be made in the described embodiments without departing from the scope and spirit of the invention. Thus, the scope of the present invention should not be limited to the exact details and structures described herein, but rather by the appended claims and equivalents.

Although the present invention has been described with reference to preferred embodiments, workers skilled in the art will recognize that changes may be made in form and detail without departing from the spirit and scope of the invention.

What is claimed is:

1. A method of selecting cells in an integrated circuit design suitable for use in logic restructuring of an original design, wherein the original design includes a parameter set, the method comprising:
    (a) forming a restructuring set having restructuring cells, wherein the restructuring set includes at least an initial cell;
    (b) forming a candidate set adapted to include candidate cells, where each candidate cell is connected to at least one of the restructuring cells;
    (c) if the number of restructuring cells is equal to or greater than a pre-selected limit number of restructuring cells, proceeding to (j), else proceeding to (d);
    (d) if the number of candidate cells is equal to zero, proceeding to (j), else proceeding to (e);
    (e) removing a selected candidate cell from the candidate set;
    (f) for each restructuring cell connected to the selected removed candidate cell, determining a corresponding cell pair parameter;
    (g) if the cell pair parameter is included in the parameter set proceeding to (h), else proceeding to (d);
    (h) placing the removed candidate cell into the restructuring set;
    (i) placing all cells connected to the removed candidate cell into the candidate set and proceeding to (c); and
    (j) returning a complete restructuring set.

2. The method of claim 1 wherein returning the complete restructuring set includes adding all bounded cells to the restructuring set.

3. The method of claim 1 wherein candidate set is exclusive of the restructuring set.

4. The method of claim 1 and further including determining if the candidate cell is in the restructuring set, wherein the determining proceeds from (e), and if the candidate cell is in the restructuring set, proceeding to (d), else proceeding to (f).

5. The method of claim 1 wherein the parameter set is formed with a process comprising:
    identifying connected cell pair in a symmetrical design;
    identifying quartets for each connected cell pair in the symmetrical design;
    generating the parameter set including each unique quartet for the symmetrical design.

6. The method of claim 1 wherein each cell pair parameter comprises a quartet including an output cell type, output pin number, input pin number and input cell type.

* * * * *